United States Patent [19]

Herold et al.

[11] Patent Number: 4,948,674

[45] Date of Patent: Aug. 14, 1990

[54] METHOD OF APPLYING A METAL LAYER OF LARGE ADHESIVE STRENGTH ON ENAMELS

[75] Inventors: Roland Herold; Eveline Dannenberg; Klaus Majentny; Hermann-Josef Middeke, all of Berlin, Fed. Rep. of Germany

[73] Assignee: Schering Aktiengesellschaft, Berlin Bergkamen, Fed. Rep. of Germany

[21] Appl. No.: 241,594

[22] Filed: Sep. 7, 1988

[30] Foreign Application Priority Data

Sep. 14, 1987 [DE] Fed. Rep. of Germany ....... 3731167

[51] Int. Cl.$^5$ ................................................. B32B 9/00
[52] U.S. Cl. ..................................... 428/469; 427/57; 427/304; 427/309; 427/443.2; 428/457; 428/696; 428/697; 428/699; 428/702; 428/704
[58] Field of Search .............. 427/57, 344, 404, 419.4, 427/443.2, 304, 309; 428/457, 469, 696, 697, 699, 702, 704

[56] References Cited

U.S. PATENT DOCUMENTS 4,532,015 7/1985 Boultingaouse et al. .......... 204/38.4

Primary Examiner—Bernard D. Pianalto
Attorney, Agent, or Firm—Michael J. Striker

[57] ABSTRACT

To achieve a high adhesive strength of a metallization on an enamel, the surface of the enamel is first roughened and simultaneously treated by ultrasound to remove loose particles. Then the layer is conditioned by a wetting agent, activated and the metal layer is deposited chemically. Particularly good results are obtained when the conditioning and activation of the surface are performed at a temperature slightly elevated above room temperature, about 40° C., for about 5 minutes and the roughening is performed chemically by treating with a 2% solution of ammonium hydrogen fluoride. The enamel substrates of our invention are limited to enamels, which are glass-like or partially crystallne salts of polysilicic acid which may incorporate oxides of alkali metals, alkaline-earth metals, aluminum, lead, boron, cobalt, nickel, titanium, zinc or zirconium or inorganic additives such aas sulphites, fluorides or arsenites 26 Claims, No Drawings

METHOD OF APPLYING A METAL LAYER OF LARGE ADHESIVE STRENGTH ON ENAMELS

BACKGROUND OF THE INVENTION

The present invention relates in general to a method of metallizing enamels. From DE-OS 35 35 972 it has been already known to provide an enamel with a metal layer having a large adhesive strength. The prior art method is based on stoving or penetrating by burning a thick layer of a metallic paste. Its disadvantage is the high temperature necessary for stoving the metallization and also the expensive manufacture of suitable metal pastes.

Moreover for metallic multilevel connections of a circuit structure such pastes are not particularly suitable. In general they exhibit relatively low electrical conductivity and the thickness of the applied layer (the height of the conductor) is limited at most to 10 microns.

SUMMARY OF THE INVENTION

It is therefore a general object of the present invention to overcome the aforementioned the disadvantages.

In particular, it is an object of the invention to provide a method which makes it possible to achieve by technically simple means a metallization on enamels having a large adhesive strength.

In keeping with this object and others which will become apparent hereafter, one feature of the invention resides in a method comprising the steps of roughening a surface of the enamel, cleaning the surface with the aid of ultrasound, conditioning the surface with a wetting agent, activating the surface and chemically metallizing the activated surface.

The roughening step is carried out mechanically and/or by chemical means. The chemical roughening uses acids such as mineral acids, particularly hydrogen halides or organic acids, or bases such as alkali hydroxide, particularly sodium hydroxide or salts such as phosphates or fluorides particularly ammonium hydrogen fluoride. For the ultrasonic treatment an ultrasonic vibrator for agitating an aqueous solution is used. The wetting agent can be either an anionic, a cationic or a nonionic wetting medium. Preferably, the wetting medium is combined with a sulphuric acid solution. The activization of the treated enamel surface is made by means of a palladium, complex.

The method of this invention makes it possible to metallize workpieces of enamel of an arbitrary configuration for example tubular workpieces or openings in the workpieces whereby a very high adhesive strength of the metallization is achieved which fact from the technological point of view is of extraordinary importance. Moreover, since in the subsequent galvanization or metal plating process arbitrary metals or metal layers of a desired quality and thickness are deposited on the enamel surface, it is for the first time made possible to produce arbitrary metal structures on the enamel surface.

Special glasses which can be considered as salts of polysilicic acids can be also used as enamels and can be bonded to a metal such as steel or copper by fusion at a temperature over 425° C. The closed structure of such salts is partially opened by the oxides of alkaline- and/or alkaline-earth groups. Also, oxides of elements of higher valency such as aluminum, lead, boron, cobalt, nickel, titanium, zinc and/or zirconium can be built into the lattice of the silicic acid or so can be also inorganic additives such as sulphites, fluorides, and/or arsenites. The enamel can be in the form of a glass like or partially crystalline structure.

As mentioned before, the roughening of the surfaces of the enamel can be made mechanically and/or chemically. Preferably, a mechanical-chemical roughening proceeds such that the surface of the enamel is first enlarged by sand jets and then by means of an etching solution, for example by an ammonium hydrogen fluoride solution, narrow trenches are etched into the enamel along its mechanical stresses or microfissures. As a rule, the requisite micro roughness can be achieved by an etching process only for which purpose particularly an ammonium hydrogen fluoride solution is suitable, and the etching step if desired can be completed by a treatment in an acid mixture.

After the roughening an ultrasonic treatment follows which serves for removing loose material from the roughened surface of the enamel. The latter step is essential for achieving a high adhesive strength of the metal to be deposited on the surface. Ultrasonic energy is applied either simultaneously during the etching of the surface or thereafter, for example during a washing step during which the workpiece is immersed into a cleaning bath upon which an ultrasonic vibrator is acting. A short period of dwell for example 5 minutes is in most cases sufficient for the ultrasonic treatment. The ultrasonic treatment is performed at room temperature or at a slightly increased temperature.

The roughened and cleaned enamel is then conditioned by wetting medium for the subsequent activation. Anionic, cationic as well as nonionic wetting agent in a 1 % solution are suitable for the conditioning step. The pH-value of the solution is not critical. Satisfactory results are obtained with a conditioning solution containing 2 % of sulphuric acid. A time period of 5 minutes has been found as optimum for duration of the conditioning. The conditioning takes place at room temperature or at a slightly increasd temperature. After the conditioning step follow the activation of the surface of the enamel, preferably by means of palladium nuclei. For this purpose an aqueous solution of a palladium complex is used whose pH value preferably is near 10.5 so that the surface of the enamel is not attacked by the activator. The activation step is performed at a slightly increased temperature (about 40° C.) and the preferred duration of this step is also about 5 minutes. After the reduction of the palladium ions through the metal nuclei the surface of the enamel is chemically metallized in a reductive bath without external current. The enamel parts metallized according to the invention are applicable in electrical technology and in electronics.

The following examples serve for the clarification of the invention.

EXAMPLE 1:

A steel core coated with a glass-like cobalt containing enamel is blasted with corundum particles of a diameter of about 50 microns until the enamel surface is uniformly matted. Then the thus treated workpiece is etched for 5 minutes at room temperature in a 5 % solution of ammonium hydrogen fluoride under the exposure to ultrasound, then the surface is freed from adhered fluoride by washing under the effect of ultrasound and dried at 150° C. Thereafter the workpiece is treated for 5 minutes in an acid conditioner at 40° C. as a preparation for an activation, then after an intermediate washing it is immersed for 5 minutes into the activator palladium solution, washed, the $Pd^{2+}$ on the surface of the workpiece is during 5 minutes reduced to metal by a suitable reductor and subsequently is coated in a chemical reduction with a layer of 3 microns. The adhesive strength of the metal layer on the enamel is 0.75 N/mm (in a peeltest).

EXAMPLE 2:

A perforated copper plate coated with an enamel having a low contents of alkali is degreased by an alkali tensid and immersed for 5 minutes into a 2 % solution of ammonium hydrogen fluoride at room temperature and exposed to ultrasound. Subsequently it is washed under the effect of ultrasound. Similarly as in Example 1 the surface of the enamel is conditioned, activated and metallized. An adhesive strength of the copper layer on the enamel of 1.2 N/mm has been measured in a peel-test.

EXAMPLE 3:

A perforated steel plate has been electrophoretically coated with a recrystallized glass ceramic. The workpiece was roughened for 10 minutes in a 1 % solution of ammonium hydrogen fluoride at 40° C. then after-treated under the exposure to ultrasound in a 10 % soda lye. Then the enamel was similarly as in the above described examples conditioned, activated and metallized. After the metallization an adhesive strength between copper and enamel of 0.6 N/mm has been measured.

EXAMPLE 4:

A metal plate insulated in the same manner as in Example 3 has been treated for 5 minutes in a mixture of fluoroboric acid and methane sulphonic acid (20 %) at room temperature under ultrasonic treatment and then washed. After the conditioning, activating and metallizing, an adhesive strength of 1.4 N/mm has been measured.

EXAMPLE 5:

A perforated steel plate was coated with a recrystallized enamel with a low contents of alkali, then degreased by immersion in an alkali solution of a detergent and under the exposure to ultrasound has been immersed in a solution of ammonium hydrogen fluoride. After the washing, conditioning and activation a 3 micron thick copper layer was deposited on the surface by a chemical reduction. Then a lamina of photoresist was deposited on the copper surface and exposed through a pattern. After developing the resist the free surface of the metal has been galvanically reinforced with copper and with a final layer of nickel and gold. After stripping of the resist and the removal of the basis metallization the resulting printed circuit board has been complemented with conventional component parts.

While the invention has been described as embodied in specific examples, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. A method of applying a metal layer of a large adhesive strength onto an enamel selected from the group consisting of glass-like and partially crystalline salts of polysilicic acid, comprising the steps of roughening a surface of the enamel; cleaning the surface with the aid of ultrasound; conditioning the surface with a wetting agent; activating the surface; and chemically metallizing the surface after said activating step.

2. A method as defined in claim 1, wherein said cleaning with said ultrasound is made simultaneously with said roughening step.

3. A method as defined in claim 1, wherein said roughening step includes roughening by chemical means.

4. A method as defined in claim 3, wherein said chemical means includes treating said surface with an acid.

5. A method as defined in claim 4, wherein said acid is selected from the group consisting of mineral acids including hydrogen halide acids.

6. A method as defined in claim 4, wherein said acid is an organic acid.

7. A method as defined in claim 3, wherein said chemical means includes treating said surface with a base.

8. A method as defined in claim 7, wherein said base is selected from the group comprising alkali hydroxides including sodium hydroxide.

9. A method as defined in claim 3, wherein said chemical means includes treating said surface with a salt.

10. A method as defined in claim 9, wherein said salt is selected from the group consisting of phosphates and fluorides including ammonium hydrogen fluorides.

11. A method as defined in claim 1, wherein said roughening step includes roughening by mechanical and chemical means.

12. A method as defined in claim 1, wherein said cleaning step includes the exposure of the treated surface to an ultrasonic vibrator.

13. A method as defined in claim 12, wherein the ultrasonic vibrator acts in a cleaning solution.

14. A method as defined in claim 13, wherein said cleaning solution includes water.

15. A method as defined in claim 1, wherein said wetting agent is selected from the group consisting of an anionic, cationic and nonionic wetting agent.

16. A method as defined in claim 15, wherein the wetting agent is in a solution of sulphuric acid.

17. A method as defined in claim 1 wherein the activizing step is made by means of a palladium complex.

18. A metallized enamel produced according to the method of claim 1.

19. A method according to claim 1, wherein said, salts of polysilicic acid incorporate an oxide selected from the group consisting of alkali metal oxides, alkaline-earth metal oxides, aluminum oxides, lead oxides, boron oxides, cobalt oxides, nickel oxides, titanium oxides, zinc oxide and zirconium oxide.

20. A method according to claim 1, wherein said salts of polysilicic acid incorporate an inorganic additive selected from the group consisting of sulphides, fluorides and arsenites.

21. In a method of applying a metal layer of a large adhesive strength onto an enamel selected from the group consisting of glass-like and partially crystalline salts of polysilicic acid comprising roughening a surface of the enamel and ultrasonically treating the surface of said enamel, the improvement wherein said method further comprises the steps of conditioning the surface with a solution containing 2 % sulfuric acid for about 5 minutes at about 40° C. and activating by immersion in a solution of $Pd^{+2}$ at about a temperature of about 40° C. for about 5 minutes and chemically metallizing the surface so activated, said roughening being performed by treating said enamel with a 2 % solution of ammonium hydrogen fluoride at room temperature.

22. A method of applying a metal layer according to claim 21, in which said roughening further comprises treating said enamel in a mixture of fluoroboric acid and methane sulphonic acid (20 %) at room temperature.

23. A metallized enamel produced according to the method of claim 22.

24. A method of applying a metal layer according to claim 21, in which said ultrasonically treating occurs simultaneously with an etching of said surface for about five minutes.

25. A method according to claim 21, wherein said salts of polysilicic acid incorporate an oxide selected from the group consisting of alkali metal oxides, alkaline-earth oxides, aluminum oxides, lead oxides, boron oxides, cobalt oxides, nickel oxides, titanium oxides, zinc oxide, zirconium oxide and mixtures thereof.

26. A method according to claim 21, wherein said salts of polysilicic acid incorporate an inorganic additive selected from the group consisting of sulphides, fluorides and arsenites.

* * * * *